United States Patent
Martensson et al.

(10) Patent No.: US 9,398,697 B2
(45) Date of Patent: Jul. 19, 2016

(54) METHODS AND DEVICES FOR JETTING VISCOUS MEDIUM ON WORKPIECE

(71) Applicants: Gustaf Martensson, Solna (SE); Mattias Allberg, Stenhamra (SE); Per Lundell, Huddinge (SE)

(72) Inventors: Gustaf Martensson, Solna (SE); Mattias Allberg, Stenhamra (SE); Per Lundell, Huddinge (SE)

(73) Assignee: MYCRONIC AB, Taby (SE)

( * ) Notice: Subject to any disclaimer, the term of this patent is extended or adjusted under 35 U.S.C. 154(b) by 0 days.

(21) Appl. No.: 13/800,779

(22) Filed: Mar. 13, 2013

(65) Prior Publication Data

US 2014/0262012 A1    Sep. 18, 2014

(51) Int. Cl.
| | | |
|---|---|---|
| *B29C 65/00* | (2006.01) | |
| *B32B 37/00* | (2006.01) | |
| *B32B 38/14* | (2006.01) | |
| *B29C 65/48* | (2006.01) | |
| *H05K 7/14* | (2006.01) | |
| *H05K 7/18* | (2006.01) | |
| *H05K 9/00* | (2006.01) | |
| *H01L 23/552* | (2006.01) | |
| *H05K 3/12* | (2006.01) | |
| *B05C 5/02* | (2006.01) | |
| *B05C 11/10* | (2006.01) | |
| *B32B 38/00* | (2006.01) | |
| *B29C 65/52* | (2006.01) | |

(52) U.S. Cl.
CPC .............. *H05K 3/125* (2013.01); *B05C 5/0225* (2013.01); *B05C 11/1002* (2013.01); *B29C 65/522* (2013.01); *B32B 38/145* (2013.01); *B32B 2457/08* (2013.01); *H05K 2203/013* (2013.01)

(58) Field of Classification Search
CPC ...... B32B 38/14; B32B 38/145; B32B 37/00; B32B 37/12; B32B 37/1284; B32B 37/1292; B32B 37/0076; B32B 37/0084; B29C 65/00; B29C 65/48; B29C 65/52; B29C 65/524; B29C 65/522; B05D 1/26; H05K 9/00; H05K 9/0007; H05K 9/0009; H05K 9/002; H05K 9/0022; H05K 9/0024; H05K 9/0026; H05K 9/0028; H01L 23/552; H01L 2924/3025; G06F 1/182
USPC ........... 156/60, 277, 290, 291, 293, 295, 297, 156/299, 300, 303.1; 361/816, 818, 800; 343/841, 702; 257/659, E23.114
See application file for complete search history.

(56) References Cited

U.S. PATENT DOCUMENTS

| | | | | |
|---|---|---|---|---|
| 5,377,081 | A * | 12/1994 | Bizen et al. | 361/818 |
| 6,501,663 | B1 * | 12/2002 | Pan | 361/779 |
| 7,757,391 | B2 | 7/2010 | Holm et al. | |
| 2002/0105080 | A1 * | 8/2002 | Speakman | B41J 2/01 257/749 |
| 2002/0105358 | A1 * | 8/2002 | Ohashi | B60R 16/0215 326/136 |
| 2003/0098342 | A1 * | 5/2003 | Ohashi | B23K 3/06 228/256 |
| 2006/0103788 | A1 * | 5/2006 | Kurosawa | H01L 24/32 349/110 |
| 2010/0129525 | A1 * | 5/2010 | Shida | H05B 33/10 427/10 |
| 2011/0017841 | A1 * | 1/2011 | Holm et al. | 239/71 |

* cited by examiner

*Primary Examiner* — Philip Tucker
*Assistant Examiner* — Brian R Slawaski
(74) *Attorney, Agent, or Firm* — Harness, Dickey & Pierce, P.L.C.

(57) ABSTRACT

In a method for jetting droplets of viscous medium on a workpiece, a jetting machine iteratively jets the droplets of viscous medium from a jetting nozzle onto a first surface of the workpiece to form a single continuous mass of material at an edge of the first surface of the workpiece. At least a portion of the single continuous mass of material extends past the edge of the first surface and adheres to a second surface of the workpiece.

19 Claims, 17 Drawing Sheets

METHODS AND DEVICES FOR JETTING VISCOUS MEDIUM ON WORKPIECE

TECHNICAL FIELD

The invention relates to a method for jetting droplets of viscous medium on a workpiece, and a jetting machine that jets droplets of viscous medium from a jetting nozzle onto a first surface of the workpiece to form a single continuous mass of material at an edge of the first surface of the workpiece.

BACKGROUND

Conventionally, deposits are formed on workpieces (e.g., substrates) prior to mounting components by jetting droplets of viscous medium (e.g., solder paste, glue, etc.) onto the workpiece. A conventional jetting system generally includes a nozzle space for containing a relatively small volume of viscous medium prior to jetting, a jetting nozzle coupled to the nozzle space, an impacting device for impacting and jetting the viscous medium from the nozzle space through the jetting nozzle in the form of droplets, and a feeder for feeding the medium into the nozzle space.

Since production speed is a relatively important factor in the manufacturing of electronic circuit boards, the application of viscous medium is typically performed "on the fly" (i.e., without stopping for each location on the workpiece where viscous medium is to be deposited).

A conventional method for depositing viscous medium past an edge surface of a workpiece includes capillary needle dispensing together with optical systems that identify the pad where the dispensed material will be applied. This conventional method of capillary needle dispensing has certain limitations, including limitations in dispensing speed and sensitivity. The dispensing speed is limited because the dispensing system must stop for each location on the substrate to make contact with the position on the workpiece where a certain amount of viscous medium is to be deposited. The sensitivity to surface topology is limited due to the relatively small dispensing distance of the dispensing head.

SUMMARY

One or more example implementations of the technology disclosed relate to methods and systems for (iterative) jetting of droplets of viscous medium to create off-set strips (rows, strings, stripes, etc.) of viscous medium or material on a workpiece such as a substrate, board, card, etc.

At least one example implementation of the technology disclosed provides a method and a system for jetting droplets onto workpieces where the deposit of the plurality of overlapping (continuous and mutually off-set) strips (strings, stripes, rows, etc.) of material (e.g., viscous medium) are formed by (iterative) jetting of droplets to create a single continuous mass of material of (deposited) strips of viscous medium. The droplets are jetted such that certain amounts of the viscous medium wrap over the edge of the horizontal surface of the workpiece and adhere to the adjacent vertical surface.

According to at least some example implementations of the technology disclosed, the strips may be jetted relatively close to an edge of the workpiece by using ejector-based non-contact jetting technology, thereby creating a single mass of material that carries over at least some of the jetted viscous medium to the adjacent vertical surface of the edge of the workpiece.

At least one example implementation of the technology disclosed provides a method for jetting droplets of a viscous medium on a workpiece using ejector-based non-contact jetting technology. According to at least this example implementation of the technology disclosed, the method includes: iteratively jetting droplets of the viscous medium from at least one jetting nozzle onto a first surface of the workpiece to form a single continuous mass of material at an edge of the first surface of the workpiece. The iterative jetting of droplets of the viscous medium onto the first surface is performed while the at least one jetting nozzle is in motion without stopping at each location on the workpiece where viscous medium is to be deposited. At least a portion of the single continuous mass of material is carried past the edge of the first surface of the workpiece.

According to at least some example implementations of the technology disclosed, the iteratively jetting may include: iteratively jetting a plurality of strips of the droplets of the viscous medium, each of the plurality of strips of droplets being closer to the edge of the workpiece than previously jetted strips of droplets. At least a last of the plurality of strips of droplets of the viscous medium may include deposits that extend past the edge of the workpiece and adhere to a second surface of the workpiece.

Each of the plurality of strips of droplets may be off-set in distance from the edge of the workpiece to create the single continuous mass of material. The second surface may be at least substantially perpendicular to the first surface. The plurality of strips of the droplets of the viscous medium may be iteratively jetted from a first distance from the edge of the workpiece toward the edge of the workpiece.

According to at least some example implementations of the technology disclosed, the portion of the single continuous mass of material may be carried past the edge at least partly by gravity and the impulse of the jetting of the viscous medium.

A volume of each individual droplet to be jetted onto the workpiece may be between about 100 pL and about 30 nL. A dot diameter for each individual droplet may be between about 0.1 mm and about 1.0 mm. A speed of an impacting mechanism for impacting the jetting nozzle with a pressure impulse may be between about 5 m/s and about 50 m/s.

According to at least some example implementations of the technology disclosed, the method may further include: feeding, between each impact of an impacting mechanism for impacting the jetting nozzle, a controlled amount of the viscous medium into a nozzle space of a jetting chamber to adjust a volume of viscous medium in the nozzle space. The amount of viscous medium fed into the nozzle space may be determined based on a volume of each individual droplet to be jetted onto the workpiece. A volume of each individual droplet may be only partially controlled by a stroke length of the impacting mechanism. A speed of the impacting mechanism may be adjusted to build up at least one of strips and the single continuous mass of viscous medium having at least one of a first height and a 3D profile.

A rate at which the controlled amount of viscous medium is fed into the nozzle space may be adjusted, and the method may further include: controlling a feeding rate within a jetting sequence such that the amount of viscous medium is fed into the nozzle space during a time period between the jetting of successive droplets within the jetting sequence.

According to at least some example implementations of the technology disclosed, the height of the jetted droplets may be varied by adjusting a speed of a pressure impulse of an ejector of the at least one jetting nozzle.

At least a portion of the single continuous mass of material may bleed past the edge and adhere to a second surface of the workpiece.

At least one other example implementation of the technology disclosed provides a method for attaching a radio frequency shield to a workpiece. According to at least this example implementation of the technology disclosed, the method includes: iteratively jetting droplets of viscous medium; and attaching the radio frequency shield to the first and second surfaces of the workpiece using the viscous medium. The iteratively jetting includes: iteratively jetting droplets of the viscous medium from at least one jetting nozzle onto a first surface of the workpiece to form a single continuous mass of material at an edge of the first surface of the workpiece. The iterative jetting of droplets of the viscous medium onto the first surface is performed while the at least one jetting nozzle is in motion without stopping at each location on the workpiece where viscous medium is to be deposited. At least a portion of the single continuous mass of material is carried past the edge of the first surface of the workpiece. The at least a portion of the single continuous mass of material is carried past the edge and adheres to a second surface of the workpiece.

According to at least some example implementations of the technology disclosed, the iteratively jetting includes: iteratively jetting a plurality of strips of the droplets of the viscous medium, each of the plurality of strips of droplets being closer to the edge of the workpiece than previously jetted strips of droplets. At least a last of the plurality of strips of droplets of the viscous medium includes deposits that extend past the edge of the workpiece and adhere to the second surface of the workpiece.

At least one other example implementation of the technology disclosed provides a method for jetting droplets of viscous medium on a workpiece. According to at least this example implementation of the technology disclosed, the method includes: jetting a single strip of droplets of viscous medium from at least one jetting nozzle onto a first surface of the workpiece to form a single continuous mass of material at an edge of the first surface of the workpiece, at least a portion of the single continuous mass of material extending past the edge and adhering to a second surface of the workpiece, the second surface being at least substantially perpendicular to the first surface.

At least one other example implementation of the technology disclosed provides a method for jetting droplets of viscous medium on a workpiece where the forming of a single continuous mass of material at an edge of the first surface of the workpiece is performed by the continuous forward movement over the workpiece by one ejector jetting droplets to form one single strip of viscous medium on the workpiece. According to at least this example implementation of the technology disclosed, the method includes: jetting a single strip of droplets of viscous medium from one jetting nozzle onto a first surface of the workpiece to form a single continuous mass of material at an edge of the first surface of the workpiece, at least a portion of the single continuous mass of material extending past the edge and adhering to a second surface of the workpiece, the second surface being at least substantially perpendicular to the first surface.

At least one other example implementation of the technology disclosed provides a method for jetting droplets of viscous medium on a workpiece where the jetting of the droplets forming the single continuous mass of material at an edge of the first surface of the workpiece is performed by the continuous forward movement over the workpiece by a plurality of jetting nozzles (or ejectors) jetting droplets to form a plurality of partly overlapping strips of viscous medium on the workpiece. According to at least this example implementation of the technology disclosed, the method includes: jetting a strips of droplets of viscous medium from a plurality of jetting nozzles (or ejectors) onto a first surface of the workpiece to form a single continuous mass of material at an edge of the first surface of the workpiece, at least a portion of the single continuous mass of material extending past the edge and adhering to a second surface of the workpiece, the second surface being at least substantially perpendicular to the first surface.

According to at least some example implementations of the technology disclosed, the iteratively jetting includes: iteratively jetting a plurality of strips of the droplets of viscous medium, each of the plurality of strips of droplets being closer to the edge of the workpiece than previous ones of the plurality of strips of droplets. A last of the plurality of strips of viscous medium includes deposits extending past the edge of the workpiece and adhering to the second surface of the workpiece.

At least one other example implementation of the technology disclosed provides a method for attaching a radio frequency shield to a workpiece. According to at least this example implementation of the technology disclosed, the method includes: iteratively jetting droplets of viscous medium; and attaching the radio frequency shield to the first and second surfaces of the workpiece using the viscous medium. The iteratively jetting includes: iteratively jetting the droplets of viscous medium from a jetting nozzle onto a first surface of the workpiece to form a single continuous mass of material at an edge of the first surface of the workpiece, at least a portion of the single continuous mass of material extending past the edge and adhering to a second surface of the workpiece, the second surface being at least substantially perpendicular to the first surface.

BRIEF DESCRIPTION OF DRAWINGS

The drawings described herein are for illustration purposes only and are not intended to limit the scope of the present disclosure in any way.

DETAILED DESCRIPTION

Figure 1:
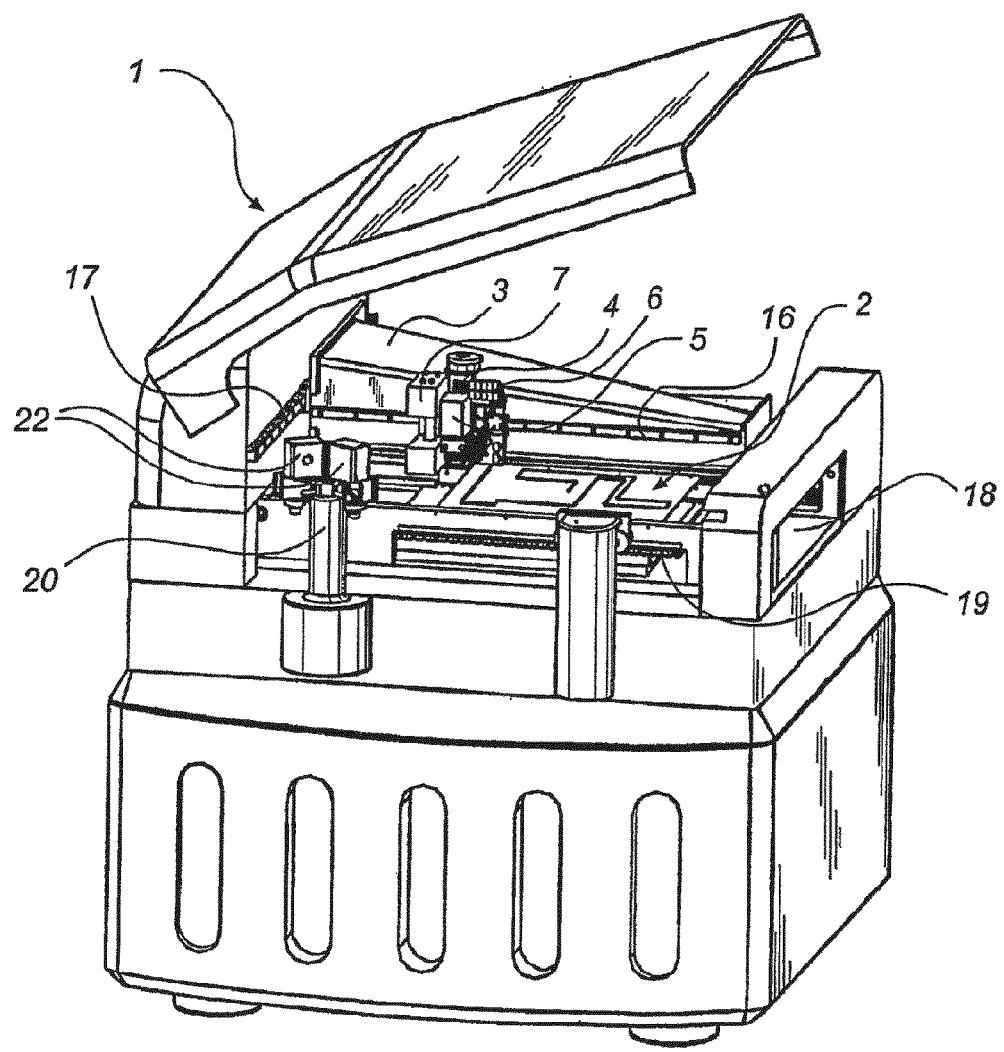
FIG. 1 is a perspective view showing the general outline of a machine to apply viscous medium including a system for jetting according to an example implementation of the technology disclosed.

Example implementations of the technology disclosed are provided so that this disclosure will be thorough, and will fully convey the scope to those who are skilled in the art. Numerous specific details are set forth such as examples of specific components, devices, and methods, to provide a thorough understanding of implementations of the technology disclosed of the present disclosure. It will be apparent to those skilled in the art that specific details need not be employed, that example implementations of the technology disclosed may be embodied in many different forms and that neither should be construed to limit the scope of the disclosure. In some example implementations of the technology disclosed, well-known processes, well-known device structures, and well-known technologies are not described in detail.

The terminology used herein is for the purpose of describing particular example implementations of the technology disclosed only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example implementations of the technology disclosed.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As discussed herein, "viscous medium" may be solder paste, flux, adhesive, conductive adhesive, or any other kind of medium used for fastening components on a substrate, conductive ink, resistive paste, or the like. However, example implementations of the technology disclosed should not be limited to only these examples. The term "deposit" refers to a connected amount of viscous medium applied at a position on a workpiece as a result of one or more jetted droplets.

For at least some solder paste applications, the solder paste may include between about 40% and about 60% by volume of solder balls and the rest of the volume is solder flux. The solder balls are typically about 20 microns in diameter, or within about 10 to about 30 microns in diameter.

In at least some solder paste applications, the volume percent of solder balls of average size may be in the range of between about 5% and about 40% of the entire volume of solid phase material within the solder paste. In other applications, the average diameter of the first fraction of solder balls may be within the range of between about 2 and about 5 microns, while the average diameter of a second fraction of solder balls may be between about 10 and about 30 microns.

The term "deposit size" refers to the area on the workpiece, such as a substrate, that a deposit will cover. An increase in the droplet volume generally results in an increase in the deposit height as well as the deposit size.

A "workpiece" may be a board (e.g., a printed circuit board (PCB) or flexible PCB), a substrate for ball grid arrays (BGA), chip scale packages (CSP), quad flat packages (QFP), wafers, flip-chips, or the like.

According to one or more example implementations of the technology disclosed, a jetting material (e.g., viscous medium such as a solder paste, conductive adhesive, adhesive, etc.) is applied to a horizontal and vertical substrate surface by iteratively jetting rows of a viscous medium successively closer to the edge of the workpiece.

At least one example implementation of the technology disclosed provides a method for jetting viscous medium onto a workpiece. According to at least this example implementation of the technology disclosed, the method includes: jetting a plurality of rows of deposits on the workpiece beginning at a first distance from the edge of the workpiece toward the edge of the workpiece. Each of the plurality of rows of deposits partially overlap a previous and adjacent row of deposits, and the row of jetted deposits at the edge of the workpiece overlaps the edge and adheres to an adjacent vertical surface of the workpiece.

Some other example implementations of the technology disclosed provide devices and arrangements to perform the methods described herein.

According to at least some example implementations of the technology disclosed for the at least one row of jetted deposits closest to the edge of the workpiece, the amount of the viscous medium overlapping the edge may measure approximately the radius or less than the radius (e.g., between about 30% and about 50% of the radius) of the jetting deposit at the edge of the workpiece. In this regard, even though the viscous medium overlapping the edge is less than about 45% of the radius of the jetting deposit at the edge of the workpiece, less than about 50% (e.g., between about 20% and about 45%) of the droplet of viscous medium remains on one surface of the workpiece, whereas the remaining portion of the droplet bleeds over to the adjoining or adjacent vertical surface. In this case, even though the central point of impact for the shots of viscous medium, or jetted deposits, is still on the horizontal surface, the larger portion of the viscous medium forming the (last) row of jetted deposits closest to the edge wraps over (overlaps) the edge and adheres to the vertical surface. As discussed herein the horizontal and vertical surfaces are directly adjacent to one another.

The iterative jetting discussed herein provides an anchoring position for the deposit that adheres to the vertical surface. If the anchoring position is lacking, then the deposit may impact on the edge, but have a level of kinetic energy sufficient to carry the deposit past the edge surface.

To ensure the positioning of the deposit with respect to the edge of the workpiece, it is relatively important to have detailed information of the area of deposit. If the size of the edge pad varies, then the position of the edge may be identified to facilitate jetting of droplets onto the surface of the workpiece.

FIG. 1 illustrates an example of a jetting machine 1 configured to jet droplets of a viscous medium onto a workpiece 2. For ease of description, the example shown in FIG. 1 is described with regard to the viscous medium being a solder paste.

Referring to FIG. 1, the machine 1 includes an X-beam 3 and an X-wagon 4 connected to the X-beam 3 via an X-rail 16 and reciprocally movable along the X-rail 16. The X-beam 3 is reciprocally movably connected to a Y-rail 17, thereby being movable in directions perpendicular to the X-rail 16. The Y-rail 17 is rigidly mounted in the machine 1. Movement of the X-wagon 4 and the X-beam 3 may be driven by linear motors (not shown). Example operation of the jetting machine 1 will be described in more detail below.

A conveyer 18 feeds a workpiece 2 into the jetting machine 1. When the workpiece 2 is in the appropriate position under the X-wagon 4, a locking device 19 fixes the workpiece 2 in place. A camera 7 locates fiducial markers on the surface of the workpiece 2 to determine the precise position of the workpiece 2. Viscous medium is applied to the workpiece 2 at desired locations by moving the X-wagon 4 over the workpiece 2 in a given, desired or predetermined pattern and operating the jetting assembly 5 at given, desired or predetermined locations. Example patterns and locations will be described in more detail later.

Figure 2:
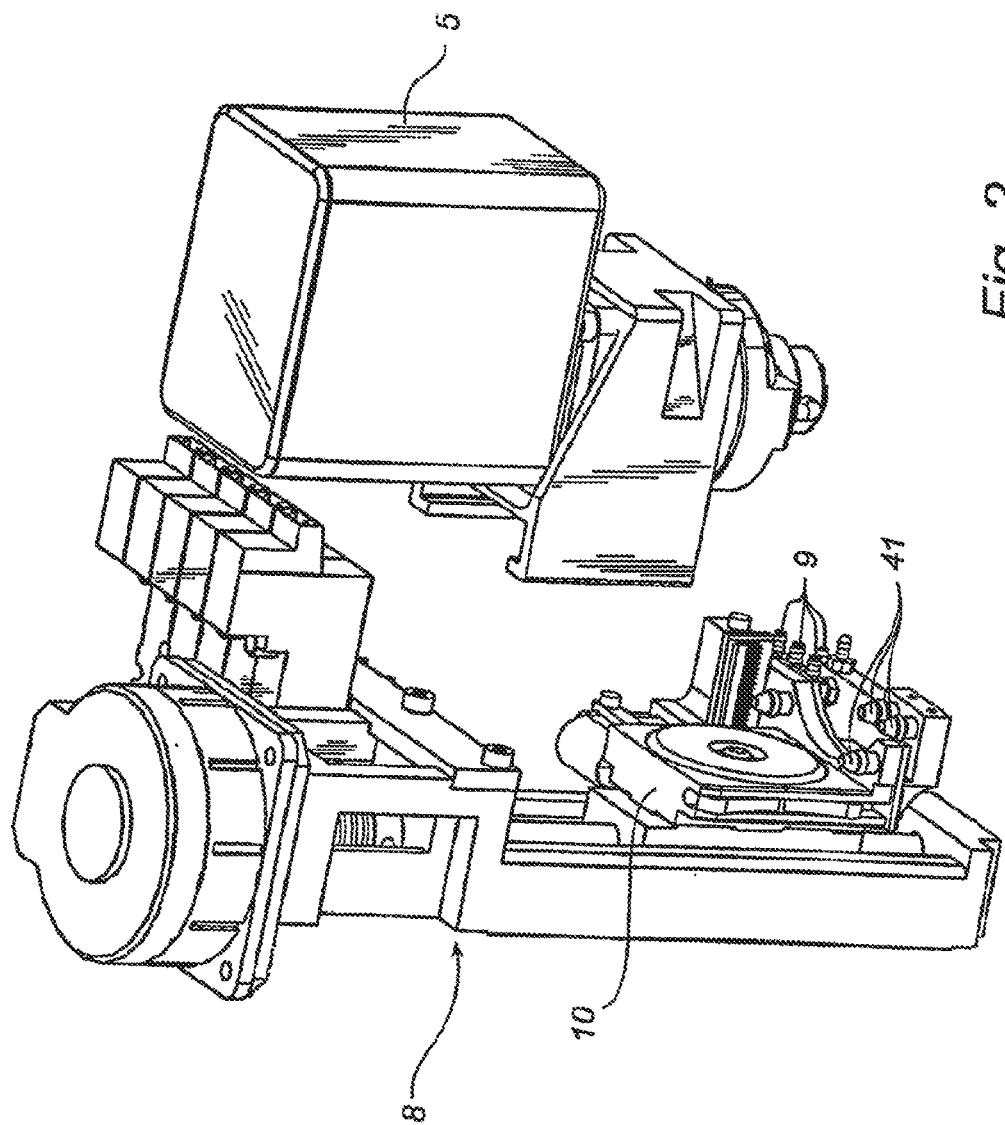
FIG. 2 is a perspective view from above of an example implementation of the technology disclosed of a docking device and a jetting assembly.

The machine 1 also includes an exchange assembly support 20, supporting further assemblies 22, which may be substituted for the jetting assembly 5 carried by the docking device 8 (e.g., FIG. 2).

Figure 3:
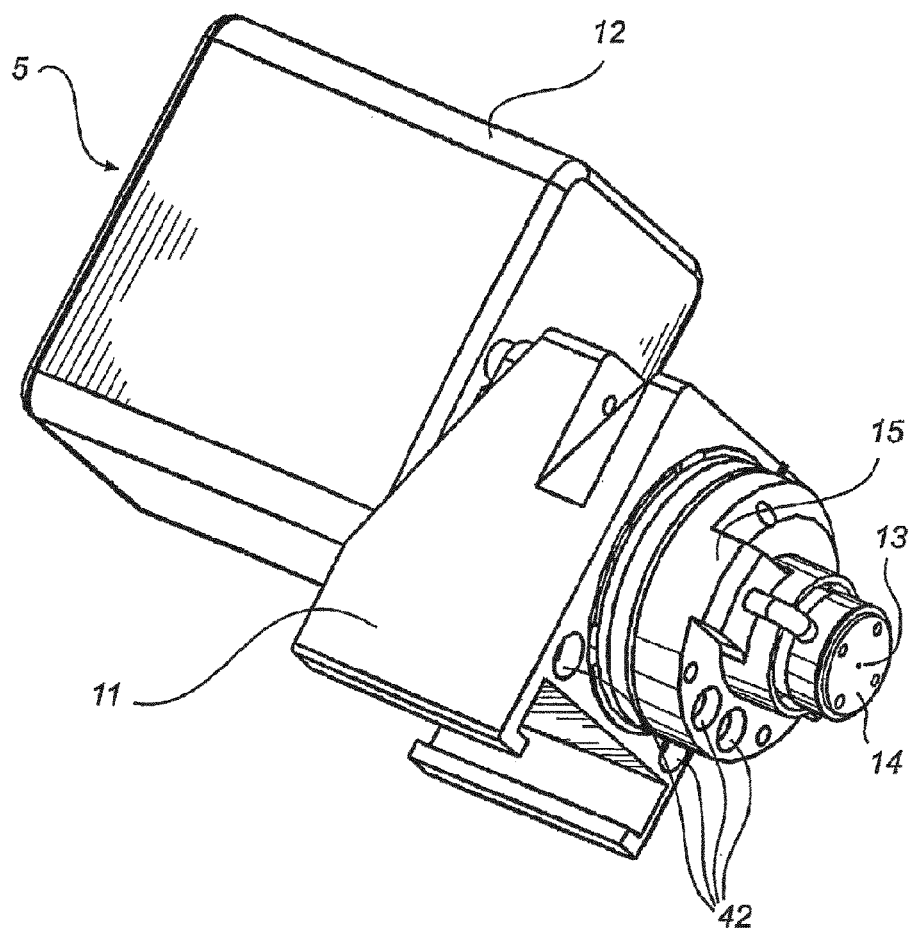
FIG. 3 is a perspective view showing the underside of the assembly shown in FIG. 2.

FIGS. 2 and 3 illustrate an example of the jetting assembly 5 in more detail.

Referring to FIGS. 2 and 3, the jetting assembly 5 includes an assembly holder 11, which is configured to connect the jetting assembly 5 to an assembly support 10 of the docking device. The jetting assembly 5 further includes an assembly housing 15 and a supply container 12 to provide a supply of viscous medium.

The jetting assembly 5 is connected to a vacuum ejector 6 in FIG. 1 and the source of pressurized air via a pneumatic interface having inlets 42 positioned to interface in airtight engagement with a complementary pneumatic interface having outlets 41 of the docking device 8. The outlets 41 are connected to inlet nipples 9 via internal conduits of the docking device 8.

Figure 4:
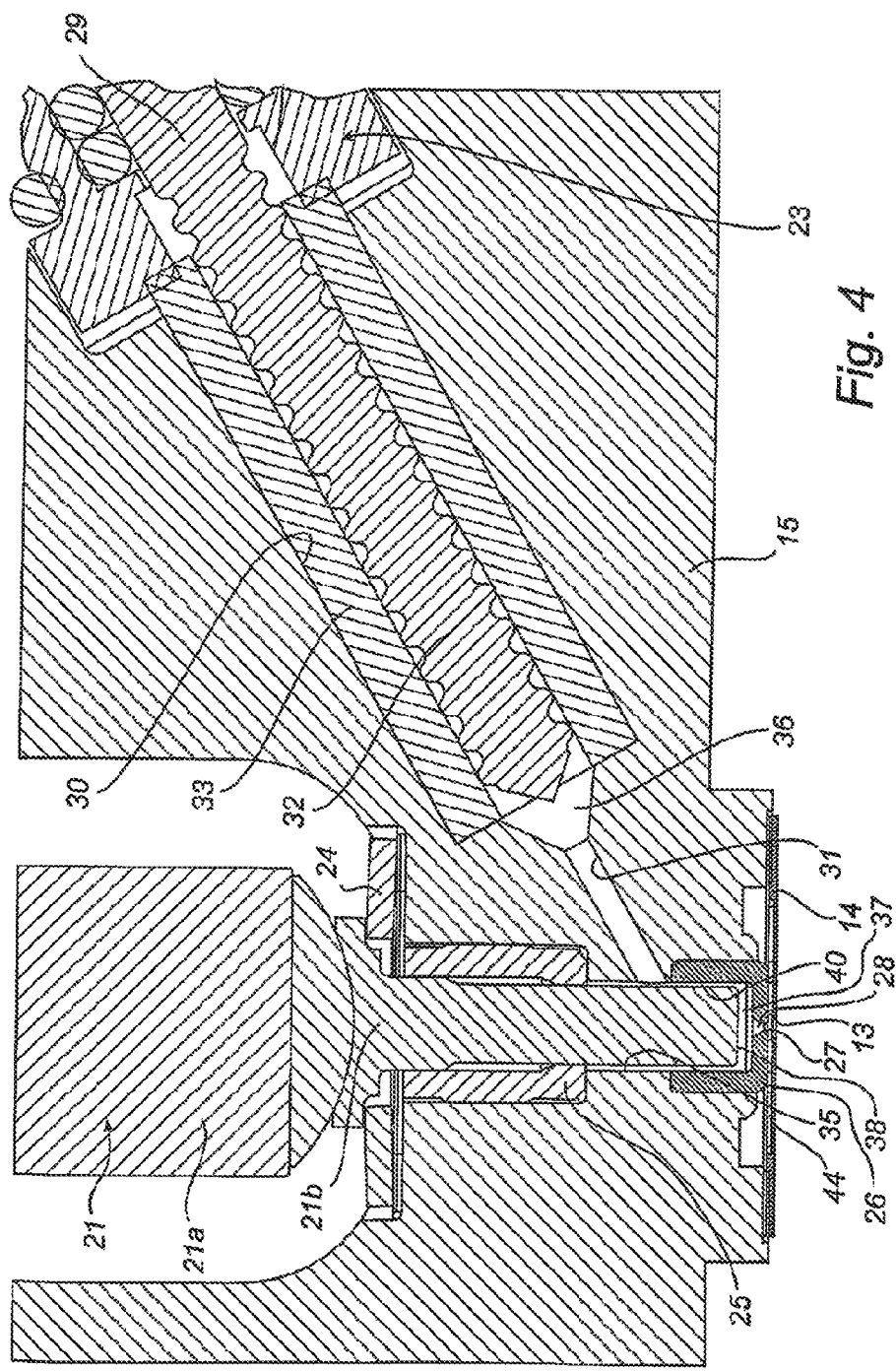
FIG. 4 is a schematic view showing a cut away portion of the assembly shown in FIG. 2.

FIG. 4 illustrates example contents and function of parts enclosed in the assembly housing 15 in more detail.

Referring to FIG. 4, the jetting assembly 5 includes an impacting device. In this example, the impacting device includes a piezoelectric actuator 21 having a number of relatively thin, piezoelectric elements stacked together to form an actuator part 21a. An upper end of the actuator part 21a is rigidly connected to the assembly housing 15. The jetting assembly 5 further includes a bushing 25 rigidly connected to the assembly housing 15. The impacting device further includes a plunger 21b, which is rigidly connected to a lower end of the actuator part 21a. The plunger 21b is axially movable while slidably extending through a piston bore 35 in the bushing 25. Cup springs 24 are provided to resiliently balance the plunger 21b against the assembly housing 15, and to provide a preload for the actuator part 21a. An ejection control unit (not shown) applies a drive voltage intermittently to the piezoelectric actuator 21, thereby causing an intermittent extension thereof, and hence a reciprocating movement of the plunger 21b with respect to the assembly housing 15, in accordance with pattern printing data.

An impact end surface 38 of the piston portion of the plunger 21b is arranged relatively close to the nozzle 26. A jetting chamber 37 is defined by the end surface 38 of the plunger 21b, the cylindrical inner wall of the nozzle 26, the upper surface 92 (FIG. 7) of the nozzle 26 and the upper end 96 (FIG. 7) of the nozzle space 28. Thus, the jetting chamber 37 is connected to the upper portion of the nozzle space 28. Axial movement of the plunger 21b towards the nozzle 26 caused by the intermittent extension of the piezoelectric actuator 21 may result in a decrease (e.g., relatively rapid decrease) in the volume of the jetting chamber 37, and thus pressurization (e.g., a rapid pressurization) and jetting of the viscous medium in the nozzle space 28 through the nozzle outlet 27.

Solder paste is supplied to the jetting chamber 37 from the supply container 12 (FIG. 3) via a feeder 23. The feeder 23 includes an electric motor (not shown) having a motor shaft 29 partly provided in a tubular bore 30, which extends through the assembly housing 15 to an outlet port 36. The outlet port 36 communicates with the jetting chamber 37 via a tubular bore 31 provided in the housing 15, and an annular space formed between the piston portion of the plunger 21b and a cylindrical inner wall provided by the piston bore 35 and the upper cylindrical inner wall 40 of the nozzle 26, respectively. The annular space extends from the outlet of the tubular port 31 down to the jetting chamber 37.

An end portion of the motor shaft 29 forms a rotatable feed screw 32 which is provided in, and coaxial with, the tubular bore 30, and which ends at the outlet port 36. An essential portion of the rotatable feed screw 32 is surrounded by a tube 33, made of an elastomer or the like, arranged coaxially therewith in the tubular bore 30. Threads of the rotatable feed screw 32 make sliding contact with the innermost surface of the tube 33. An example of an alternative to the tube is an array of resilient, elastomeric O-rings.

The jetting assembly 5 further includes a plate shaped or substantially plate shaped jetting nozzle 26 operatively directed against the workpiece 2, onto which small droplets of viscous medium are to be jetted. A through hole is formed through the jetting nozzle 26.

Figure 7:
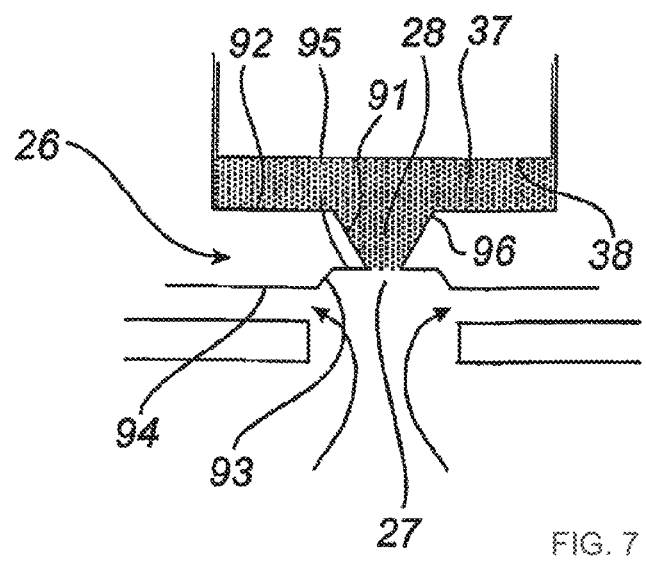
FIG. 7 is a schematic view of a nozzle according to an example implementation of the technology disclosed.

FIG. 7 illustrates an example implementation of the technology disclosed of the nozzle 26 in more detail.

Referring to FIG. 7, the through hole is defined by a first frustro-conical portion 91, extending from a top surface 92 of the nozzle 26 downwards through a portion of (e.g., most of) the thickness of the nozzle 26, and a second frustro-conical portion 93 extending upwards from a bottom surface 94 of the nozzle 26 to the plane of the top of the first frustro-conical portion 91. Thus, the tops of the frustro-conical portions 91, 93 are directed towards (or face) each other. The diameter of the top of the second frustro-conical portion 93 is larger than the diameter of the top of the first frustro-conical portion 91. The first and second frustro-conical portions 91, 93 are connected by a ring portion 95, which is in parallel with the top and bottom surfaces 92, 94 of the nozzle 26. The top of the first frustro-conical portion 91 defines a nozzle outlet 27 through which the droplets of viscous medium are jetted onto the workpiece 2. Furthermore, a nozzle space 28 is defined by the inner walls of the first frustro-conical portion 91. Thus, the nozzle outlet 27 is located at a lower portion 95 of the nozzle 26.

The upper portion 96 of the nozzle 26 (the base of the first frustro-conical portion 91) is arranged for receiving viscous medium, which is forced through the nozzle space 28 and out of the nozzle outlet 27.

A plate or wall 14 (FIG. 3) is arranged below, or downstream, of the nozzle outlet 27, as seen in the jetting direction. The plate 14 is provided with a through hole 13, through which the jetted droplets pass without being hindered or negatively affected by the plate 14. Consequently, the hole 13 is concentric with the nozzle outlet 27. The plate 14 is spaced apart from the nozzle outlet 27. Between the plate 14 and the nozzle outlet 27, an air flow chamber 44 is formed. The chamber 44 is a space acting as a channel or guide that is connected with the vacuum ejector 6 for generating an air flow as illustrated, for example, by the arrows of FIG. 7, at and past the nozzle outlet 27. In this example, the air flow chamber 44 is disc shaped, and the hole 13 acts as an inlet for the air flow towards and past the nozzle outlet 27.

The degree of filling of the nozzle space 28 before each jetting is set in order to obtain a controlled and individually adjusted amount of viscous medium in each droplet.

Figure 5A:
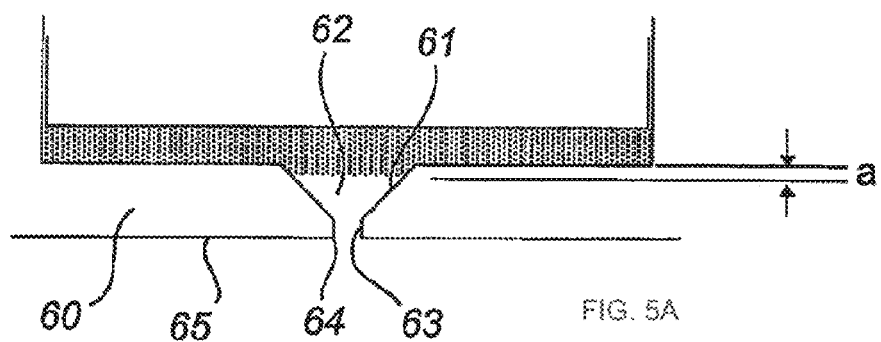
FIGS. 5A-5C illustrate different example degrees of viscous medium filling a nozzle space.
Figure 5B:
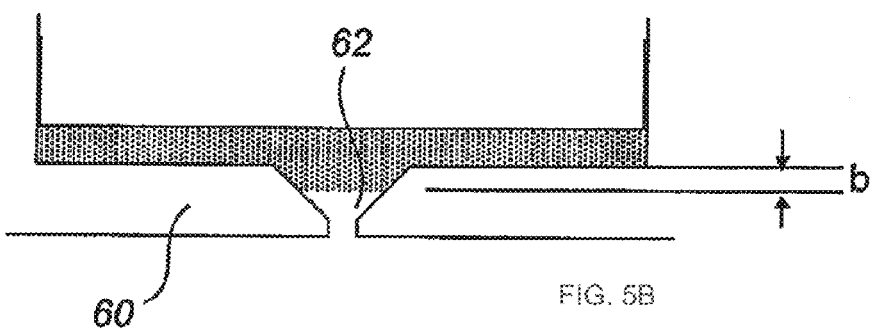
Figure 5C:
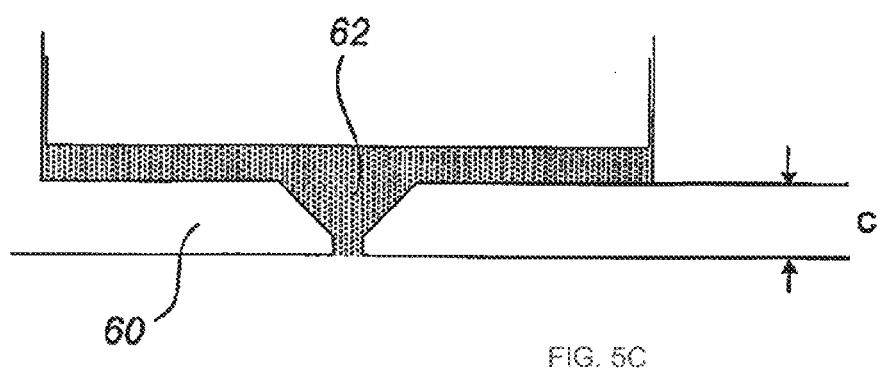

Example degrees of filling are shown in FIGS. 5A-5C, which illustrate an alternative configuration of the nozzle 60. The nozzle 60 still includes a frustro-conical portion 61 that defines a portion of the nozzle space 62. However, rather than the second frustro-conical portion 93, the nozzle 60 includes a cylindrical portion 63. The upper end of the cylindrical portion 63 coincides with the top end of the frustrum of a conical portion 61, and the lower end of the cylindrical portion 63 is positioned at the bottom surface 65 of the nozzle 60. In this alternative example, the nozzle outlet 64 is defined by the lower end of the cylindrical portion 63.

As seen from FIGS. 5A-5C, the nozzle space 62 is filled from the upper portion thereof towards the nozzle outlet 64. Thus, if the nozzle space 62 is filled to a relatively small extent, as shown in FIG. 5A, a comparatively small droplet is jetted, whereas if the nozzle space is filled or substantially filled, as in FIG. 5C, a larger droplet is jetted.

Figure 6A:
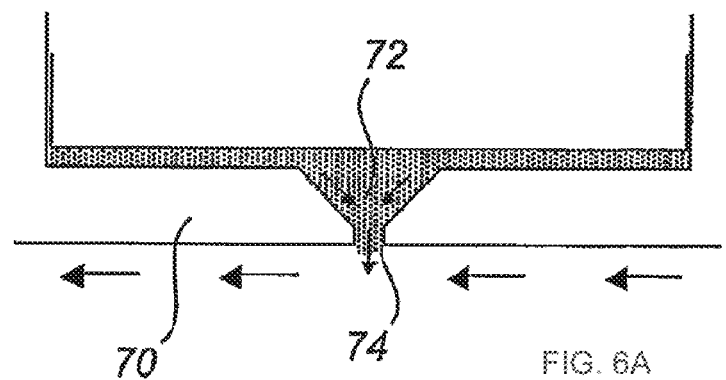
FIGS. 6A and 6B illustrate operation principles according to an example implementation of the technology disclosed.
Figure 6B:
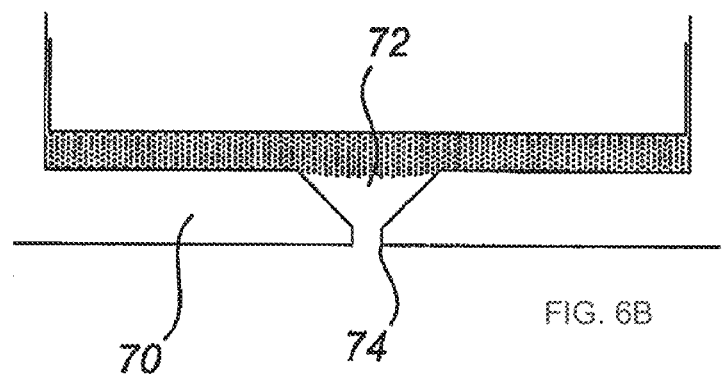

As shown in FIGS. 6A and 6B, before jetting a first droplet after a pause, or at start-up of the jetting machine, the accuracy of the degree of filling of the nozzle space, in these figures denoted 72, is ascertained. This may be obtained by feeding viscous medium into the nozzle space 72 via the feed screw 32 (shown in FIG. 4) such that the viscous medium fills or substantially fills the nozzle space 72, as shown in FIG. 6A. In this process, relatively small amounts of viscous medium may be forced out of the nozzle outlet 74. Thanks to the suction function obtained by air flow, excessive viscous medium is supressed and/or prevented from falling onto a board located beneath the nozzle 70. The air flow is schematically indicated by the horizontal arrows in FIG. 6A. It is noted that for ease of description, the plate downstream of the nozzle outlet has been omitted from FIGS. 6A and 6B, as well as in FIGS. 5A-5C. During this process, the plunger 21b is held in an idle position.

The volume of the jetting chamber is increased by retracting the plunger 21b. The plunger 21b is retracted by controlling the actuator part 21a. The plunger 21b is retracted to move the end surface a given, desired or predetermined distance so as to empty the nozzle space 28/72 to an accurately given, desired or predetermined extent. In the example shown in FIG. 6B, the nozzle space 72 has been substantially emptied of viscous medium. Having now obtained the appropriate degree of filling of the nozzle space 28/72, the jetting device is ready for impacting. Droplets may then be jetted essentially immediately to ensure that there is little or no time for substantive changes in the jetting conditions to occur.

The jetting sequence then begins by feeding viscous medium into the nozzle space 28 in accordance with information on what size of droplet that is to be jetted. When the feeding is complete, the actuator 21 is energized to obtain an impacting movement of the plunger 21b. The impacting movement of the plunger 21b rapidly decreases the volume of the jetting chamber 37 to such an extent that the amount of viscous medium that is present in the nozzle space 28 is jetted out of the nozzle outlet 27 and onto the workpiece 2.

Referring back to FIG. 1, the machine 1 is configured to jet series of droplets consecutively in rows or strips to form a continuous mass of viscous medium on the workpiece 2. To do so, a stepper motor (not shown) rotating the feed screw 32 may be driven with a signal of a given, desired or predetermined frequency. In one example, pulses of a pulse signal are applied to the stepper motor. For each pulse, a known amount of viscous medium is fed into the jetting chamber. The lower curve illustrates the control signal that is applied to the actuator 21. When the control signal is high, the plunger 21b is in the idle position. When the control signal is low, the plunger 21b is in the ready position.

Figure 8A:
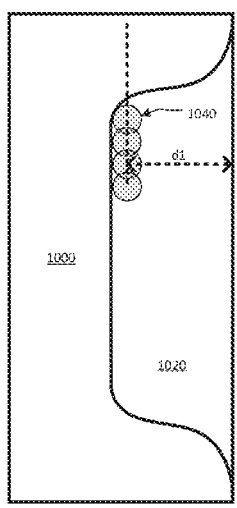
FIGS. 8A through 8C are top views illustrating a method for jetting droplets of viscous medium on a workpiece according to an example implementation of the technology disclosed.
Figure 8B:
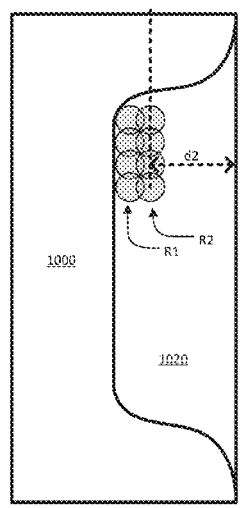
Figure 8C:
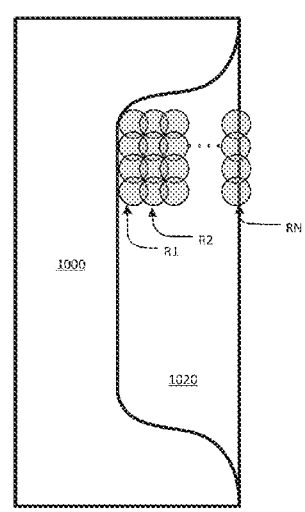
Figure 9A:
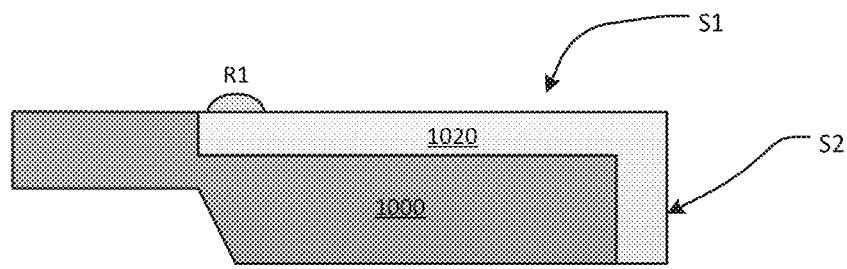
FIGS. 9A through 9C are side views illustrating the method for jetting droplets of viscous medium shown in FIGS. 8A through 8C.
Figure 9B:
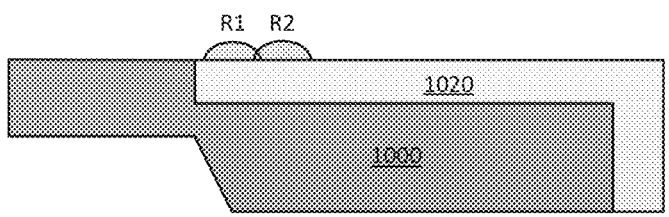
Figure 9C:
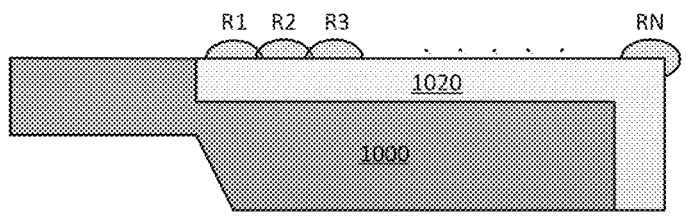

FIGS. 8A through 8C are top views illustrating a method for jetting droplets of viscous medium on a workpiece according to an example implementation of the technology disclosed. FIGS. 9A through 9C are side views illustrating the method for jetting droplets of viscous medium shown in FIGS. 8A through 8C. The method illustrated by FIGS. 8A through 9C will be described with regard to the jetting machine 1 discussed above.

Referring to FIGS. 8A through 9C, the machine 1 iteratively jets droplets 1040 of viscous medium from the jetting nozzle 26 onto a first surface S1 of an edge pad 1020 on the workpiece 1000. The machine 1 jets the droplets 1040 of viscous medium to form a single continuous mass of material on the first surface S1. As shown In FIG. 9C, for example, at least a portion of the continuous mass of material extends past the edge of the first surface S1 and adheres to a second surface S2 of the edge pad 1020 and/or workpiece 1000.

In the example shown in FIG. 9C, a portion of the droplets 1040 in row RN closest to the edge of the edge pad 1020 extend (or bleed) over the edge of the workpiece 1000. In this example, the second surface S2 is perpendicular or substantially perpendicular to the first surface S1. In one example, the first surface S1 may be oriented horizontally, whereas the second surface S2 may be oriented vertically.

Still referring to FIGS. 8A through 9C, the droplets 1040 of viscous medium are iteratively jetted in rows or strips beginning at a first distance d1 from the edge of the edge pad 1020 toward the edge of the edge pad 1020.

In more detail as shown in FIGS. 8A and 9A, the machine 1 jets a first strip R1 of droplets of viscous medium on the first surface S1 at a first distance d1 from the edge of the edge pad 1020. The droplets 1040 of viscous medium in the first strip R1 are jetted in a line (e.g., a straight or substantially straight line) and each droplet 1040 is jetted so as to partially overlap with an adjacent droplet 1040 so as to form a continuous strip of viscous medium material. The overlap between the adjacent droplets may be less than or equal to about the radius of the deposit size.

As shown in FIGS. 8B and 9B, after jetting the first strip R1, the machine 1 jets a second strip R2 of viscous medium on the first surface S1 at a second distance d2 from the edge of the edge pad 1020 and workpiece 1000. The droplets 1040 of viscous medium in the second strip R2 are jetted in the same or substantially the same manner as the droplets 1040 in the first strip R1. As can be appreciated from FIGS. 8A, 9A, 8B and 9B, the second distance d2 is less than the first distance d1.

Referring to FIGS. 8C and 9C, the machine 1 jets subsequent strips of droplets of viscous medium, each subsequent strip being formed closer to the edge of the edge pad 1020 than the previous strips of droplets of viscous medium. In this regard, each of the plurality of strips R1, R2, R3, . . . RN of droplets is off-set in distance from the edge in order to create a single continuous mass of material.

The machine 1 jets the last strip RN of viscous medium such that the droplets 1040 extend (or bleed) past the edge of the edge pad 1020 and workpiece 1000, and adhere to the second surface S2 of the edge pad 1020 and workpiece 1000.

Between each impact of the jetting nozzle 26, the machine 1 feeds a controlled amount of the viscous medium into the nozzle space 28 of the jetting nozzle 26 to adjust the volume of viscous medium in the nozzle space 28. The amount of viscous medium fed into the nozzle space 28 may be determined based on a volume of each individual droplet to be jetted onto the workpiece 1000. The volume of each individual droplet may be independent of stroke length of an impacting mechanism for impacting the jetting nozzle 26. Alternatively, the volume of each individual droplet may be only partially controlled by a stroke length of the impacting mechanism. The speed of an impacting mechanism for impacting the jetting nozzle with a pressure impulse may be between about 5 m/s and about 50 m/s.

The rate at which the controlled amount of viscous medium is fed is adjustable, and the feeding rate within a jetting sequence such may be controlled such that the amount of viscous medium is fed into the nozzle space 28 during the time period between the jetting of successive droplets within the jetting sequence.

One or more other example implementations of the technology disclosed also provide methods and devices for attaching a radio frequency (RF) shield to a workpiece (e.g., a substrate for a handheld device).

Handheld devices (e.g., smartphones, cell phones, personal digital assistants (PDAs), digital media players, tablet computers, etc.) often contain a RF shield to block RF signals. Piezo-based ejector technology's ability to jet droplets of viscous medium (e.g., solder paste) on edge pads to create continuous (offset) lines of solder paste may be used to apply the required viscous medium for shield attachment to a pad at the outer edge or an interior edge of a workpiece (e.g., a printed circuit board (PCB), flexible PCB, etc.).

An RF shield is used to protect components placed and attached to other interior pads (e.g., by first jet printing or jetting solder paste on the interior component pads) from RF signals. Line widths as small as between about 100 and about 300 microns are possible on relatively densely populated boards to avoid bridging with neighboring components. The variation of active components' quantity and sizes necessitates relatively large variations in shield geometries. Programming new jet printing patterns in shorter times may add flexibility to production lines with RF shielding applications.

When attaching the RF shield to an edge (either interior or exterior) of the workpiece, a portion of the viscous material jetted on the top surface of the workpiece wraps (or bleeds) over the edge (surface) and adheres to the adjacent vertical surface.

Figure 10:
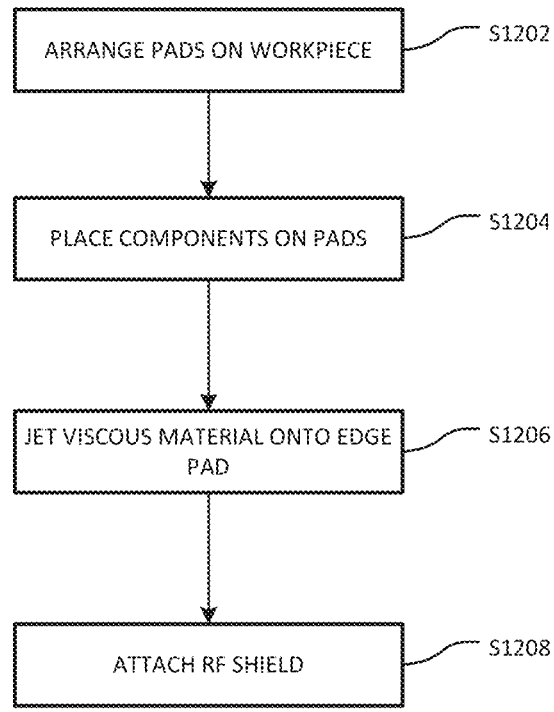
FIG. 10 is a flow chart illustrating a method for attaching a radio frequency (RF) shield according to an example implementation of the technology disclosed.
Figure 14:
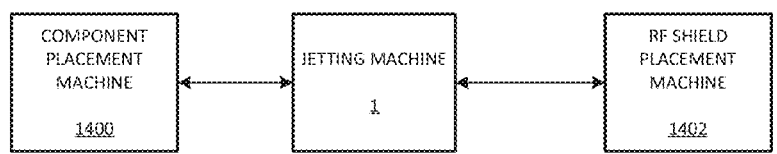
FIG. 14 is a block diagram illustrating an arrangement for attaching a RF shield according to an example implementation of the technology disclosed.

FIG. 10 is a flow chart illustrating a method for attaching a RF shield according to an example implementation of the technology disclosed. FIGS. 11A through 11D are perspective views illustrating the method shown in FIG. 10. FIG. 12A is a side view corresponding to the perspective view shown in FIG. 11D. FIG. 14 is a block diagram illustrating an arrangement for attaching a RF shield according to an example implementation of the technology disclosed. The method shown in FIG. 10 will be described in connection with FIGS. 11A through 12A and 14.

Referring to FIG. 14, the arrangement includes a component placement machine 1400, the jetting machine 1, and a RF shield placement machine 1402. Example operation of the component placement machine 1400 and the RF shield placement machine 1402 will be discussed in more detail below. Although the arrangement shown in FIG. 14 includes a component placement machine 1400 and a RF shield placement machine 1402, example implementations of the technology disclosed should not be limited to this example. Rather, the component placement machine 1400 and the RF shield placement machine 1402 may be combined into a single placement machine.

Figure 11A:
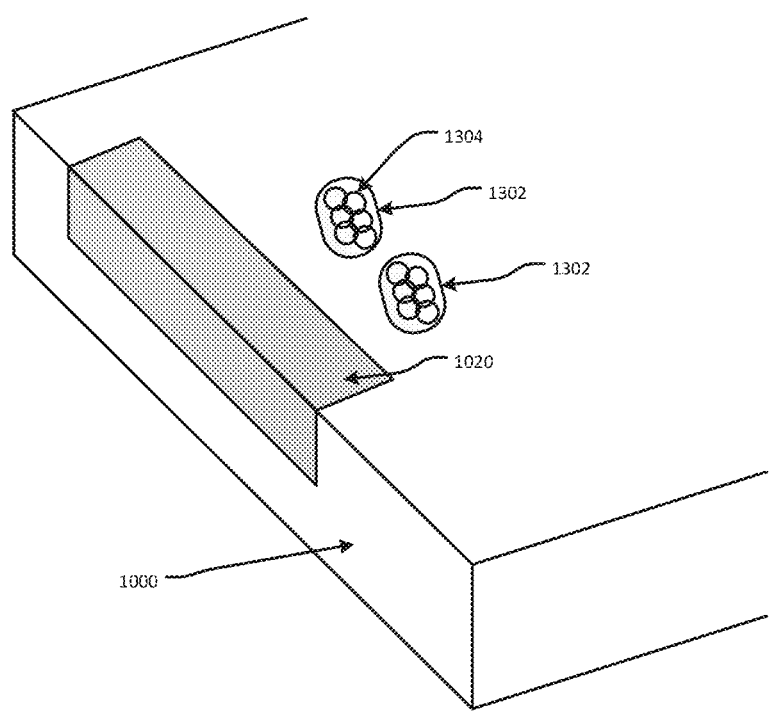
FIGS. 11A through 11D are perspective views illustrating the method shown in FIG. 10.
Figure 11B:
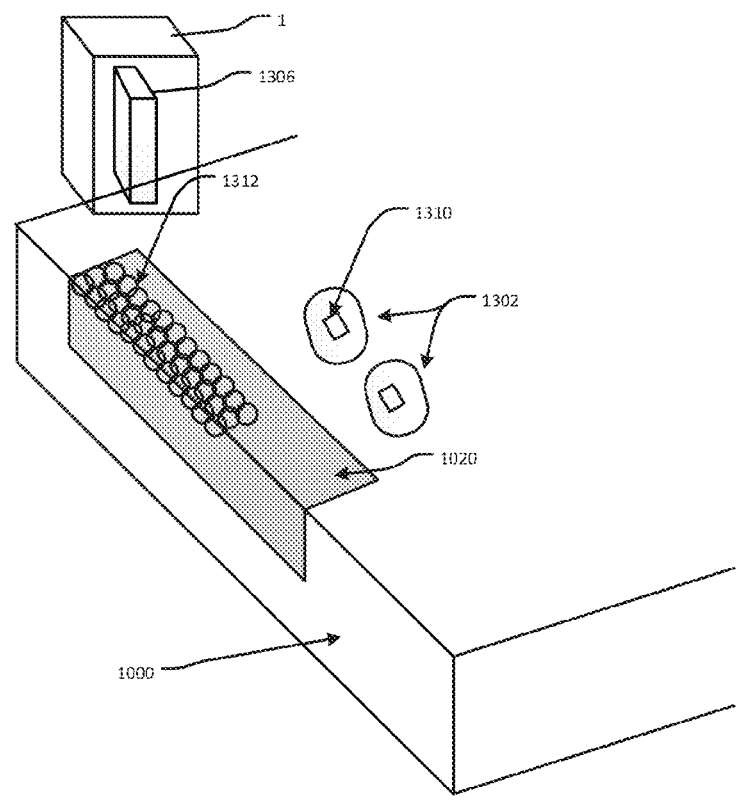
Figure 11C:
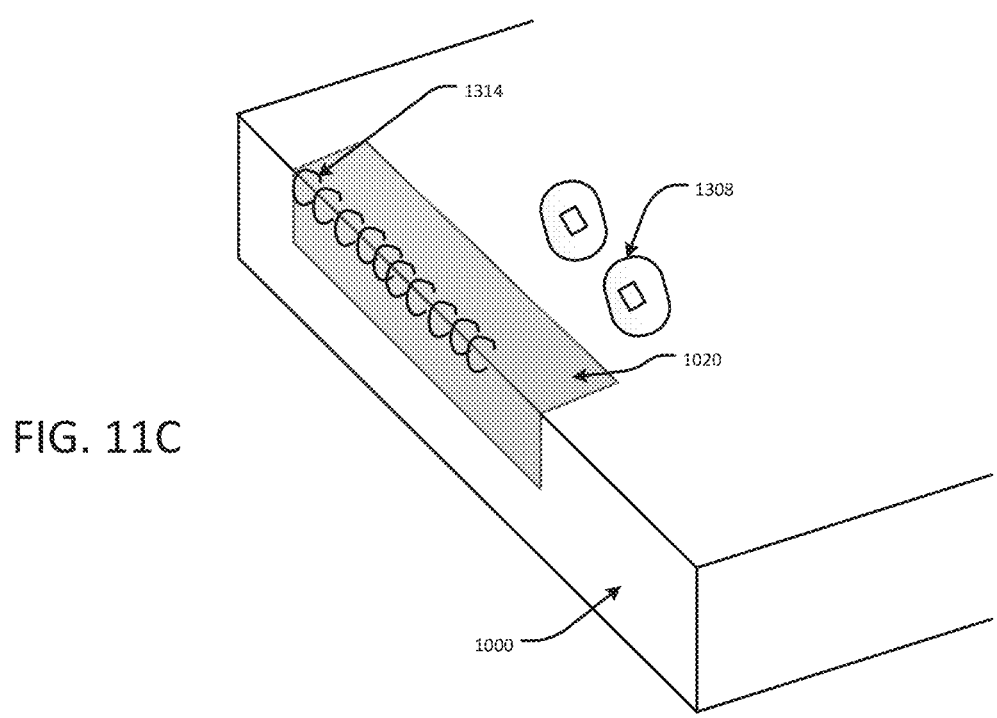
Figure 11D:
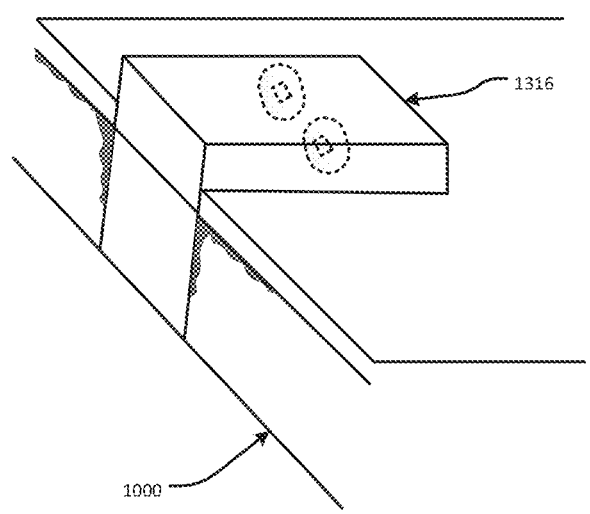
Figure 12A:
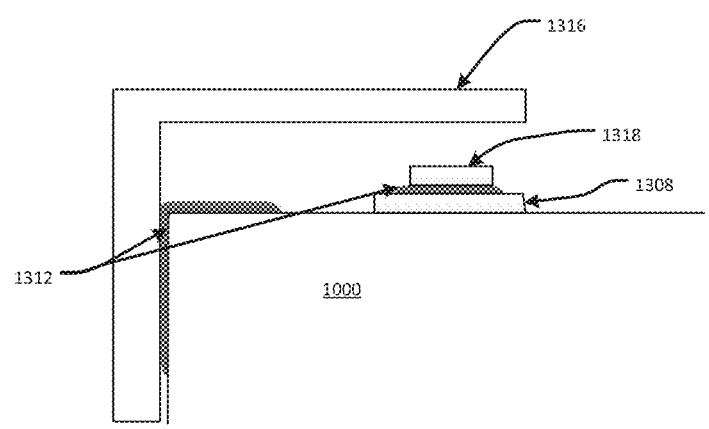
FIG. 12A is a side view corresponding to the perspective view shown in FIG. 11D.

Referring to FIGS. 10, 11A through 12A and 14, at S1202 the component placement machine 1400 arranges pads 1302 on the workpiece 1000. The pads 1302 have a solder paste 1304 formed on their upper surface. As shown in FIG. 11A, the component placement machine 1400 fixes an edge pad 1020 for shielding to an edge of the workpiece 1000.

At S1204, the component placement machine 1400 arranges components 1310 on the pads 1302. The components 1310 are adhered to the surface of the pads 1302 by the solder paste 1304.

At S1206, an ejector 1306 (FIG. 11C) of the jetting machine 1 jets viscous medium onto the edge pad 1020 in the manner described above with regard to FIGS. 8A through 9C to create a plurality of continuous lines of solder paste 1312 on the edge pad 1020. The plurality of continuous lines of solder paste 1312 form a single continuous mass of solder paste on the edge pad 1020. As shown in FIG. 11C, the solder paste is jetted onto the edge pad 1020 such that a portion 1314 of the solder paste extends past the horizontal surface of the edge pad 1020 and adheres to the vertical surface of the edge pad 1020.

In FIG. 11C, the ejector 1306 and the jetting machine 1 are shown, but simplified so as not to obscure the other portions of the figure.

At S1208, the RF shield placement machine 1402 attaches the RF shield 1316 to the workpiece 1000 as shown in FIG. 11D. The RF shield 1316 is fixed to the workpiece 1000 by the solder paste on the horizontal and vertical surfaces of the workpiece 1000. In other example implementations of the technology disclosed, the RF shield 1316 may be fixed to the workpiece 1000 by the solder paste only on the vertical surface of the workpiece 1000. The RF shield 1316 covers the components 1310 so as to suppress and/or prevent RF interference on the components.

FIG. 12A is a side view corresponding to the perspective view shown in FIG. 11D.

Referring to FIG. 12A, the solder paste wraps (or bleeds) over the edge of the edge pad 1020 onto the vertical surface of the edge pad 1020, and the RF shield 1316 is fixed to the workpiece 1000 using the solder paste on the vertical surface of the edge of the workpiece 1020, or using the solder paste on both the horizontal and vertical surfaces of the edge of the workpiece. The components 1318 are fixed to the component pads 1308 by the solder paste 1314 on the surface of the component pads 1308.

Figure 12B:
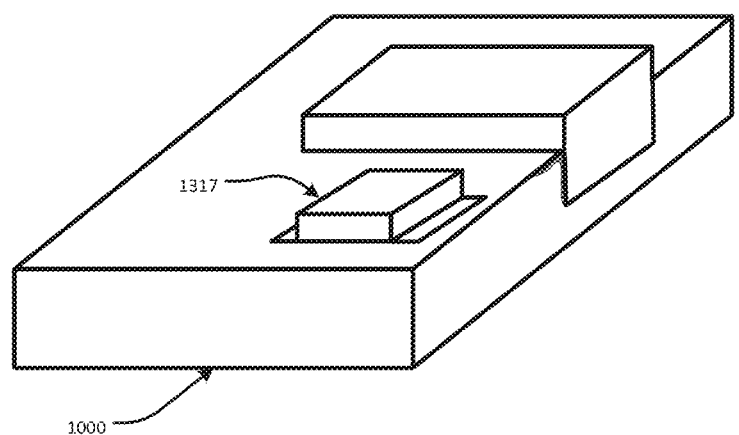
FIG. 12B illustrates a RF shield attached to a board according to another example implementation of the technology disclosed.

FIG. 12B illustrates a RF shield attached to a board according to another example implementation of the technology disclosed.

The example implementation of the technology disclosed shown in FIG. 12B is similar to the example implementation of the technology disclosed shown in FIG. 12A, but further includes a RF shield 1317 fixed to an interior of the workpiece 1000. In this example, the "edge" of the workpiece 1000 may be at an interior of the workpiece 1000, and the RF shield 1317 may be fixed to the workpiece 1000 using the solder paste on the vertical surface of the edge at the interior of the workpiece 1000 as shown in FIG. 12A, or may be fixed to the workpiece 1000 using the solder paste on both the horizontal and vertical surfaces of the edge at the interior of the workpiece 1000.

Figure 13:
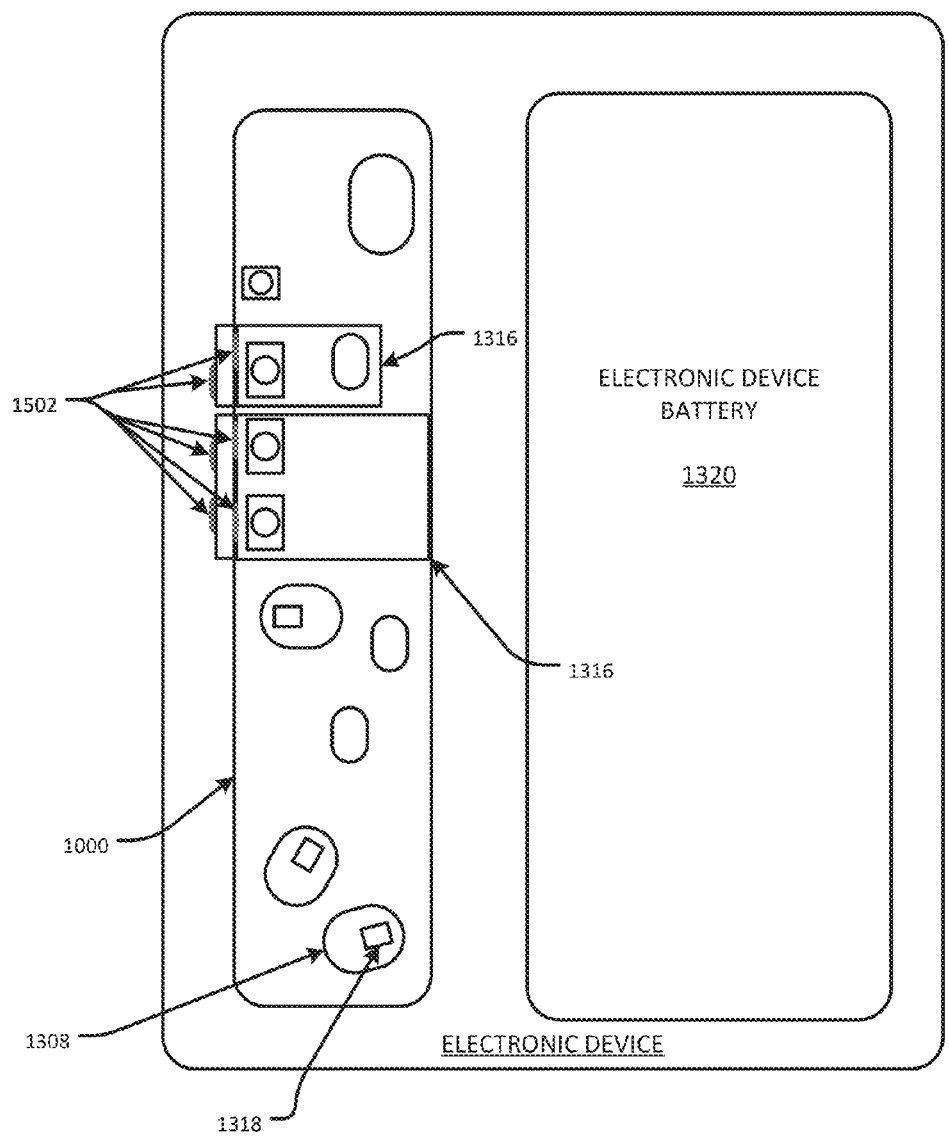
FIG. 13 is a plan view of the inside of a portion of an electronic device (e.g., a mobile phone or the like) including a RF shield fixed as discussed above with regard to FIGS. 10 through 12A.

FIG. 13 is a plan view of the inside of a portion of an interior of an electronic device (e.g., a mobile phone or the like) including an RF shield fixed as discussed above with regard to FIGS. 10 through 12A.

Referring to FIG. 13, as shown, RF shields 1316 are fixed to the surface of the workpiece (e.g., a board such as a printed circuit board (PCB) or flexible PBC) 1000 to shield at least a portion of the components 1318 from RF signals. Within the electronic device, the workpiece 1000 is arranged with a battery (e.g., a portable device battery such as a mobile phone battery or the like) 1320.

The ability to eject a more precise and/or accurate volume of viscous medium from a given distance at a specific position on a workpiece while in motion are hallmarks of viscous jetting. These characteristics allow the application of relatively highly viscous fluids (e.g., about 1 Pa s) while compensating for a considerable height variation on the board (h=about 0.4 to about 4 mm). The volumes are relatively large compared to ink jet technology (between about 100 pL and about 30 nL) as are the viscosities.

At least some example implementations of the technology disclosed provide increased speed of application due to the jetting "on the fly" principle of ejector-based jetting technology applying viscous medium without stopping for each location on the workpiece where viscous medium is to be deposited. Hence, the ability of ejector-based jetting technology of jetting droplets of the viscous medium onto a first (horizontal) surface is performed while the at least one jetting nozzle is in motion without stopping at each location provides an advantage in terms of time savings over the capillary needle dispensing technology currently used in, for example, fixing an RF shield to an workpiece.

At least some example implementations of the technology disclosed provide increased speed of application due to the non-contact application principle of jetting technology, and the ability to control the amount of paste over the pad/edge in a more detailed manner.

In at least one application of example implementations of the technology disclosed, the height of the deposit from the shots, and thereby the strips of viscous medium, may be varied by adjusting the speed of the pressure impulse (e.g., higher speed of impulse a shot give a droplet deposit with lower height and which is more spreadout) to build up the material of viscous medium, the speed of the pressure impulse may be adjusted to build up strips and/or a single continuous mass of viscous medium having a certain height and/or 3D profile.

Example areas of interest for applying the iterative jetting method according to at least some example implementations of the technology disclosed include plated edges, or regions thereof, either on the periphery of workpiece, substrate, card or board (e.g., printed circuit board (PCB)) or on milled regions in the interior of the workpiece, substrate, card or board that have been plated, including but not limited to holes, straight edges, etc.

Other application areas for example implementations of the technology disclosed include conformal coating applications and underfill applications.

The foregoing description of the implementations of the technology disclosed has been provided for purposes of illustration and description. It is not intended to be exhaustive or to limit the disclosure. Individual elements or features of a particular implementation of the technology disclosed are generally not limited to that particular implementation of the technology disclosed, but, where applicable, are interchangeable and can be used in a selected implementation of the technology disclosed, even if not specifically shown or described. The same may also be varied in many ways. Such variations are not to be regarded as a departure from the disclosure, and all such modifications are intended to be included within the scope of the disclosure.

What is claimed is:

1. A method for jetting droplets of a viscous medium on a workpiece using ejector-based non-contact jetting technology, the method comprising:

iteratively jetting a plurality of strips of droplets of the viscous medium from at least one jetting nozzle onto a first surface of the workpiece to form a single continuous mass of material at an edge of the first surface of the workpiece, each of the plurality of strips of droplets being closer to the edge of the first surface of the workpiece than previously jetted strips of droplets; wherein the iteratively jetting of the plurality of strips of droplets of the viscous medium onto the first surface is performed while the at least one jetting nozzle is in motion without stopping at each location on the workpiece where viscous medium is to be deposited, a last of the plurality of strips of droplets of the viscous medium is formed at the edge of the first surface of the workpiece, extends past the edge of the first surface of the workpiece, and adheres to a second surface of the workpiece, the last of the plurality of strips of droplets of the viscous medium is formed after all previously jetted strips of droplets of the viscous medium, and the last of the plurality of strips of droplets of the viscous medium is formed without a strip of droplets of the viscous medium formed on the second surface of the workpiece subsequent to the last of the plurality of strips of droplets of the viscous medium.

2. The method of claim 1, wherein each of the plurality of strips of droplets is off-set in distance from the edge of the workpiece to create the single continuous mass of material.

3. The method of claim 1, wherein the second surface is at least substantially perpendicular to the first surface.

4. The method of claim 1, wherein the plurality of strips of the droplets of the viscous medium are iteratively jetted from a first distance from the edge of the workpiece toward the edge of the workpiece.

5. The method of claim 1, wherein a portion of the single continuous mass of material is carried past the edge at least partly by gravity and the impulse of the jetting of the viscous medium.

6. The method of claim 1, wherein a volume of each individual droplet to be jetted onto the workpiece is between about 100 pL and about 30 nL.

7. The method of claim 1, wherein a dot diameter for each individual droplet is between about 0.1 mm and about 1.0 mm.

8. The method of claim 1, wherein a speed of an impacting mechanism for impacting the jetting nozzle with a pressure impulse is between about 5 m/s and about 50 m/s.

9. The method of claim 1, further comprising:
feeding, between each impact of an impacting mechanism for impacting the jetting nozzle, a controlled amount of the viscous medium into a nozzle space of a jetting chamber to adjust a volume of viscous medium in the nozzle space, the amount of viscous medium fed into the nozzle space being determined based on a volume of each individual droplet to be jetted onto the workpiece.

10. The method of claim 9, wherein a volume of each individual droplet is only partially controlled by a stroke length of the impacting mechanism.

11. The method as claimed in claim 9, wherein a speed of the impacting mechanism is adjusted to build up at least one of the strips and the single continuous mass of material having at least one of a first height and a 3D profile.

12. The method of claim 9, wherein a rate at which the controlled amount of viscous medium is fed into the nozzle space is adjustable, and wherein the method further includes,
controlling a feeding rate within a jetting sequence such that the amount of viscous medium is fed into the nozzle space during a time period between the jetting of successive droplets within the jetting sequence.

13. The method of claim 1, wherein a height of the jetted droplets is varied by adjusting a speed of a pressure impulse of an ejector of the at least one jetting nozzle.

14. The method of claim 1, wherein at least a portion of the single continuous mass of material bleeds past the edge and adheres to the second surface of the workpiece.

15. The method of claim 1, wherein the iteratively jetting of the plurality of strips of droplets forming the single continuous mass of material at the edge of the first surface of the workpiece is performed by continuous forward movement over the workpiece by one ejector jetting droplets to form the plurality of strips of viscous medium on the workpiece.

16. A method for attaching a radio frequency shield to a workpiece, the method comprising:
iteratively jetting a plurality of strips of droplets of viscous medium from at least one jetting nozzle onto a first surface of the workpiece to form a single continuous mass of material at an edge of the first surface of the workpiece, each of the plurality of strips of droplets being closer to the edge of the first surface of the workpiece than previously jetted strips of droplets; wherein
the iteratively jetting of the plurality of strips of droplets of the viscous medium onto the first surface is performed while the at least one jetting nozzle is in motion without stopping at each location on the workpiece where viscous medium is to be deposited,
a last of the plurality of strips of droplets of the viscous medium is formed at the edge of the first surface of the workpiece, extends past the edge of the first surface of the workpiece, and adheres to a second surface of the workpiece,
the last of the plurality of strips of droplets of the viscous medium is formed after all previously jetted strips of droplets of the viscous medium, and
the last of the plurality of strips of droplets of the viscous medium is formed without a strip of droplets of the viscous medium formed on the second surface of the workpiece subsequent to the last of the plurality of strips of droplets of the viscous medium; and
attaching the radio frequency shield to the first and second surfaces of the workpiece using the viscous medium.

17. A method for jetting droplets of viscous medium on a workpiece, the method comprising:
iteratively jetting a plurality of strips of droplets of viscous medium from a jetting nozzle onto a first surface of the workpiece to form a single continuous mass of material at an edge of the first surface of the workpiece, each of the plurality of strips of droplets being closer to the edge of the first surface of the workpiece than previous ones of the plurality of strips of droplets, wherein
a last of the plurality of strips of droplets of viscous medium is formed at the edge of the first surface of the workpiece, extends past the edge of the first surface of the workpiece, and adheres to a second surface of the workpiece, the second surface being at least substantially perpendicular to the first surface,
the last of the plurality of strips of droplets of viscous medium is formed after all previously jetted strips of droplets, and
the last of the plurality of strips of droplets of viscous medium is formed without a strip of droplets of viscous medium formed on the second surface of the workpiece subsequent to the last of the plurality of strips of droplets of viscous medium.

18. The method of claim 17, wherein the iteratively jetting of the plurality of strips of droplets forming the single continuous mass of material at the edge of the first surface of the workpiece is performed by continuous forward movement over the workpiece by a plurality of ejectors jetting droplets to form a plurality of partly overlapping strips of viscous medium on the workpiece.

19. A method for attaching a radio frequency shield to a workpiece, the method comprising:
iteratively jetting a plurality of strips of droplets of viscous medium from a jetting nozzle onto a first surface of the workpiece to form a single continuous mass of material at an edge of the first surface of the workpiece, each of the plurality of strips of droplets being closer to the edge of the first surface of the workpiece than previous ones of the plurality of strips of droplets, wherein
a last of the plurality of strips of droplets of viscous medium is formed at the edge of the first surface of the workpiece, extends past the edge of the workpiece, and adheres to a second surface of the workpiece, the second surface being at least substantially perpendicular to the first surface, the last of the plurality of strips of droplets of viscous medium is formed after all previously jetted strips of droplets, and the last of the plurality of strips of droplets of viscous medium is formed without a strip of droplets of viscous medium formed on the second surface of the workpiece subsequent to the last of the plurality of strips of droplets of viscous medium; and attaching the radio frequency shield to the first and second surfaces of the workpiece using the viscous medium.

\* \* \* \* \*